Sept. 22, 1953 K. ÖNDER 2,653,227
AMPLITUDE AND FREQUENCY MODULATION RADIO RECEIVER
Filed March 6, 1951
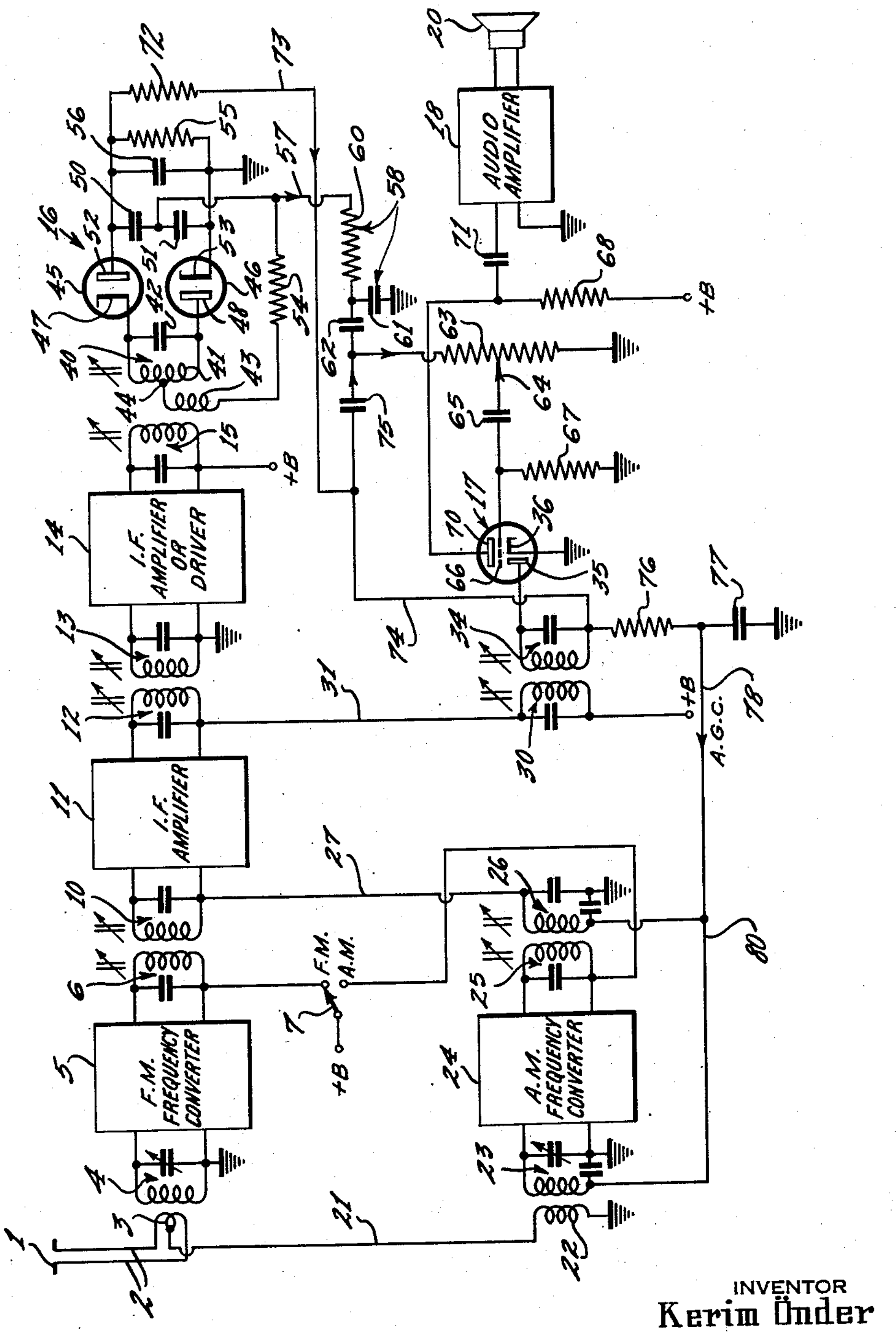
INVENTOR
Kerim Önder
BY H. O. Newton
ATTORNEY Patented Sept. 22, 1953 2,653,227

UNITED STATES PATENT OFFICE 2,653,227

AMPLITUDE AND FREQUENCY MODULATION RADIO RECEIVER

Kerim Önder, New York, N. Y., assignor to Radio Corporation of America, a corporation of Delaware Application March 6, 1951, Serial No. 214,174

2 Claims. (Cl. 250—20)

This invention relates generally to radio receivers, and more particularly relates to a broadcast receiver capable of receiving selectively either amplitude modulated (AM) carrier waves or frequency modulated (FM) carrier waves.

Receivers capable of selectively receiving either AM or FM waves are well known. Frequently, in order to save costs a superheterodyne receiver is provided with common signal conveying channels for both AM and FM waves such as the intermediate frequency (I. F.) amplifier channel and/or the modulation signal or audio frequency (A. F.) channel. In that case, it is conventional practice to provide switches in certain signal conveying channels, particularly in the oscillator circuits and in the detector output circuits, to condition the receiver for either AM or FM wave reception.

There are various objections to the use of switches in the signal conveying channels of a radio receiver. If the switches are provided in the signal conveying channels they cause uncertain operation due to the varying impedance represented by the switch contacts. Furthermore, the switches add to the cost of the receiver. Finally the provision of a switch in the signal conveying channels makes it difficult for the designer to lay out the circuit. The switch must be ordinarily located near and operated from the front of the receiver chassis with all the signal leads or wires to be switched terminating in the switch. Hence, the danger of hum pick-up in low frequency circuits and instability in radio frequency circuits from interaction is very great.

A receiver should, for best results, have no switch in the signal conveying circuits. The receiver, according to the present invention, may, for example, have two separate converters for AM and FM operation which are selectively supplied with energizing potentials through a switch connected to the power supply. A switch of this kind is not objectionable in that it is not in a radio frequency circuit.

In order to reduce costs, it is conventional practice to provide a common I. F. amplifier channel in a combined AM and FM superheterodyne receiver. If no switches are provided in the signal conveying circuits, some provision must be made to prevent interaction between the AM detector and the FM detector or discriminator. Thus, for example, during the reception of FM waves the AM detector should not develop an output signal which would otherwise be impressed on the common audio channel for both the AM detector and the FM discriminator.

It is accordingly an object of the present invention to provide an improved AM and FM receiver which is free of the difficulties caused by switches in the signal conveying channels such as the radio frequency or audio frequency circuits and which, therefore, permits trouble-free operation, provides freedom of layout for the designer and permits the realization of high efficiency in the FM signal circuit.

A further object of the invention is to provide a broadcast receiver for selectively receiving AM or FM waves which eliminates substantially any interaction between the AM and the FM circuits of the receiver.

Another object of the invention is to provide a combined AM and FM receiver of the type referred to where the AM detector is automatically rendered inoperative during reception of an FM wave without the necessity of providing switches in the detector or audio amplifier circuits.

A further object of the invention is to provide a combined AM and FM receiver with only one switch for changing from AM to FM reception and vice versa.

The combined AM and FM receiver of the invention preferably includes a ratio detector for demodulating the FM waves. The ratio detector also has circuit means for developing a gain control signal in response to slow variations of the amplitude of the received FM wave. The AM channel includes a conventional detector having a load circuit which includes a portion of the ratio detector for demodulating the AM wave and for developing a gain control signal responsive to slow variations of the amplitude of the received AM wave. The two gain control voltages are combined in such a manner that during FM operation the AM detector is rendered inoperative. The de-emphasis network which is conventionally provided in the audio output circuit of an FM detector also serves the purpose of bypassing the AM wave in the AM detector output circuit. As pointed out hereinabove separate converters are preferably provided for the reception of FM or AM waves. The converters are selectively energized by a switch supplying power to the selected converter. The provision of this switch, however, is not detrimental to the operation of the receiver and can be of a very inexpensive type.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which the single figure is a circuit diagram, partly in block form, of a combined AM-FM receiver embodying the present invention.

Referring now to the drawing, there is illustrated a combined AM-FM receiver in accordance with the invention which comprises an antenna 1 which may be a dipole as shown. The dipole antenna 1 is connected through a parallel wire line 2 across an inductor 3 which is inductively coupled with a parallel resonant circuit 4 which may be tuned by a variable capacitor as shown. Resonant circuit 4 is the input circuit of a tunable frequency converter 5 for converting the FM waves intercepted by antenna 1 to an intermediate frequency wave which may have a frequency of 10.7 mc. (megacycles). The frequency converter 5 for the FM waves has a parallel resonant output circuit 6. The required anode voltage may be obtained from a battery indicated at +B which is connected through switch 7, parallel resonant circuit 6 to the frequency converter 5. Parallel resonant circuit 10 is coupled to resonant circuit 6 and forms the input circuit of an intermediate frequency amplifier shown substantially at 11. The intermediate frequency amplifier 11 has resonant output circuit 12 inductively coupled to the resonant input circuit 13 of a further intermediate frequency amplifier or driver stage 14.

Driver stage 14 has an output circuit which may include inductor 15 which is tuned by a capacitor. The anode voltage is supplied to driver stage 14 through +B. Inductor 15 is coupled to a discriminator-rectifier generally indicated at 16 and which may, for example, be a ratio detector of the type disclosed and claimed in the copending application to E. I. Anderson, filed on January 30, 1948, Serial No. 5,406, and assigned to the assignee of this application. The output of the ratio detector 16 is impressed on an audio amplifier 17 which in turn is coupled to one or more audio amplifiers 18 and the modulation signal is reproduced by loudspeaker 20. The details of the ratio detector 16, audio amplifier 17 and their associated circuits which embody the present invention will be more fully described hereinafter.

The AM signal channels of the receiver of the invention will now briefly be described. The antenna 1 and parallel wire line 2 form a T antenna for intercepting the AM waves. The center point of inductor 3 is connected through lead 21 to an inductor 22 having its free terminal grounded as shown. Inductor 22 is coupled to parallel resonant circuit 23 which may be tuned by a variable capacitor as shown and which forms the input circuit of another frequency converter 24 for the AM waves. Converter 24 converts the received AM waves to an intermediate frequency wave which may have a frequency of 455 kc. (kilocycles). Parallel resonant circuit 25 forms the output circuit of the frequency converter 24 for the AM waves and is inductively coupled to parallel resonant circuit 26. Resonant circuit 26 is connected through lead 27 to parallel resonant circuit 10 so that the intermediate-frequency amplifier 11 may also amplify the intermediate-frequency AM waves. The necessary operating potential for the AM frequency converter 24 is selectively supplied through +B and switch 7 to the resonant output circuit 25 of the converter 24.

Parallel resonant circuit 30 is connected through lead 31 to parallel resonant circuit 12 and they form together the output circuits of the intermediate frequency amplifier 11. The energizing potential is supplied through +B, resistor 32, resonant circuit 30, 12 to the intermediate frequency amplifier 11.

Parallel resonant circuit 34 is inductively coupled to resonant circuit 30 and one of its terminals is connected to anode 35 which, together with cathode 36 of the audio amplifier 17, forms a rectifier for demodulating the AM waves. It will be understood that resonant circuits 6, 10, 12 and 13 are all tuned to the intermediate frequency of the FM wave which may be 10.7 mc. Resonant circuits 25, 26, 30 and 34 are all tuned to the intermediate frequency of the AM waves which may be 455 kc. Furthermore, resonant circuits 6, 10, 12, 13, 25, 26, 30 and 34 preferably are adjustable by ferromagnetic cores which may be provided in the inductors of the circuits as indicated. Inductor 15 may also be adjusted in the same manner.

The AM and FM demodulators or detectors, the audio circuits and the automatic gain control circuits which are part of this invention will now be described in greater detail. The ratio detector 16 has a frequency discriminator network which includes parallel resonant circuit 40 which is inductively coupled to inductor 15 forming the output circuit of the driver stage 14. Parallel resonant circuit 40 includes inductor 41 and capacitor 42 and the inductor 41 may be adjusted by a ferromagnetic core as shown. Inductors 15 and 41 form respectively the primary and secondary windings of a transformer. Inductor 43 may be considered the tertiary winding and is tightly coupled to inductor 15, one of its terminals is connected to an intermediatie point 44 of inductor 41 which may be the midpoint.

Two rectifiers 45 and 46 are connected to the discriminator network. Thus cathode 47 of rectifier 45 and anode 48 of rectifier 46 are connected respectively to the two terminals of parallel resonant circuit 40. A pair of carrier wave bypass capacitors 50 and 51 is connected between anode 52 of rectifier 45 and cathode 53 of rectifier 46. The junction point between capacitors 50, 51 is connected through resistor 54 to the other terminal of inductor or tertiary winding 43.

A long time constant network including resistor 55 and capacitor 56 arranged in parallel is connected between anode 52 and cathode 53. The network 55, 56 has a time constant which is long compared to a cycle of the FM modulation signal. Thus if the modulation signal is an audio signal, the time constant should be of the order of 0.1 second. Cathode 53 may be grounded as shown.

The demodulated FM signal is obtained through lead 57 connected to the junction point between resistor 54 and capacitors 50, 51. A conventional de-emphasis network 58 is provided in lead 57 and includes series resistor 60 and capacitor 61 having one terminal grounded as shown. The de-emphasis network 58 is coupled through coupling capacitor 62 to potentiometer resistor 63 having one terminal grounded. By means of tap 64 an adjustable portion of the modulation signal voltage is impressed through coupling capacitor 65 onto the control grid 66 of the audio amplifier 17. Grid leak resistor 67 is provided between control grid 66 and ground. The amplified modulation signal is developed across output resistor 68 which is connected between the anode voltage supply +B and anode 70 of the audio amplifier 17. The audio signal is coupled through coupling capacitor 71 to the further audio amplifiers 18.

The receiver of the invention operates in the following manner: Let it be assumed that it is desired to receive an FM wave. In that case, switch 7 will be in the position shown in the drawing. The FM wave is intercepted by antenna 1 and impressed on the energized frequency converter 5 when it is converted to an intermediate-frequency wave. The intermediate-frequency wave is further amplified by intermediate-frequency amplifiers 11 and 14 in a conventional manner. The ratio detector 16 also operates in a conventional manner. The frequency discriminator network 40, 43 develops a pair of carrier waves which are impressed on rectifiers 45, 46 and which have an amplitude which corresponds at any instant to the instantaneous frequency of the received FM wave. Thus, two carrier waves are developed at each terminal of the parallel resonant circuit 40 which have a phase depending on the instantaneous frequency of the received wave. The phases of the two waves developed at the two terminals of resonant circuit 40 are compared with that of a reference wave which is injected through tertiary winding 43 and tap 44 into resonant circuit 40. The amplitudes of the resultant waves at the terminals of resonant circuit 40 are a function of the phase relationship between the reference wave and the two waves developed across circuit 40. The resultant two waves are rectified by rectifiers 45, 46 and the demodulated signal is developed across capacitor 51.

Capacitors 50, and 51 will bypass the carrier wave. The long time constant network including resistor 55 and capacitor 56 rejects amplitude modulations of the received FM wave as is well known. The resistor 54 improves the amplitude rejection of the ratio detector as explained in the Anderson application above referred to.

The thus obtained modulation signal, which may be an audio signal, is passed through the de-emphasis network 58 as is conventional. The audio signal is then impressed through coupling capacitor 62, potentiometer 63 and coupling capacitor 65 on the control grid 66 of the audio amplifier 17. The amplified audio signal developed across output resistor 68 is then further amplified by audio amplifier 18. The operation of the FM channel of the receiver described so far is conventional.

If it is now desired to receive an AM wave, switch 7 is rotated to connect the AM frequency converter 24 with the anode voltage supply +B. The AM waves are now intercepted by antenna 1 and parallel wire lines 2 and are impressed on the frequency converter 24 where they are converted to an intermediate-frequency wave. The intermediate-frequency wave is developed in converter output circuit 25 and is impressed on input circuit 26 which is coupled through resonant circuit 10 to the intermediate-frequency amplifier 11 where it is further amplified. The amplified intermediate-frequency wave is developed in resonant circuit 30 connected through lead 31 and resonant circuit 12 to the intermediate-frequency amplifier 11.

The amplified intermediate frequency wave is impressed on resonant circuit 34 which has one of its terminals connected to anode 35 provided in audio amplifier 17. The load circuit for the audio detectors 35, 36 includes resistor 72 which is connected through leads 73 and 74 with the other terminal of resonant circuit 34. The free terminal of resistor 72 is connected through resistor 55 to ground, that is, to cathode 36. The resistance of resistor 72 should be very large compared to that of resistor 55. The demodulated AM signal is accordingly developed across resistors 72 and 55 and is impressed through coupling capacitor 75 across potentiometer 63. The audio signal is then further amplified in the manner previously described. The AM carrier wave is bypassed through coupling capacitors 75, 62 and capacitor 61 which forms part of the de-emphasis network for the FM modulation signal. In other words capacitors 75, 62, and 61 are connected across resistors 72 and 55 which represent the detector load.

In accordance with the present invention an automatic gain control (AGC) voltage is derived from both the FM and the AM demodulators and impressed through a common lead, for example, on intermediate frequency amplifier 11 and the frequency converter 24 for the AM waves. As is well known, a direct current voltage representative of the average amplitudes of the FM wave is developed across resistor 55 and capacitor 56 of the ratio detector 16. This automatic gain control voltage is derived through resistor 72 and leads 73, 74. It is now impressed on an audio filter to remove the audio signal and includes resistor 76 and capacitor 77 connected in series between lead 74 and ground. The gain control voltage without the audio signal is obtained from lead 78 connected to the junction point between resistor 76 and capacitor 77. This gain control voltage is impressed, for example, through lead 80 on resonant circuit 23 of AM frequency converter 24 and on resonant circuit 26 of intermediate frequency amplifier 11 respectively.

During reception of an AM wave a direct current voltage representative of the average amplitude of the received wave is developed across load resistors 72, 55 as well as the modulation signal. This gain control voltage is again obtained through leads 73, 74 and the audio signal is removed by filters 76, 77. This gain control voltage is impressed in the same manner on converter 24 and amplifier 11.

It will now be seen that during reception of an FM wave the gain control voltage representation of the average amplitude of the received FM wave is impressed through resonant circuit 34 on anode 35 which is thus maintained at a negative potential with respect to its cathode 36 which is maintained at ground potential. Accordingly, the audio detector for the AM waves is rendered non-conducting during FM operation of the receiver. Since the major portion of the demodulated AM signal is developed across resistor 72 (having a large resistance) the very small voltage developed across resistor 55 (having a small resistance) will have substantially no effect on the ratio detector 16. Accordingly, there is substantially no interaction between the AM and FM modulators.

While it will be understood that the circuit specification of the receiver of the invention may vary according to the design for any particular application, the following circuit specifications are included, by way of example only, as suitable for an intermediate frequency of 10.7 mc. for the FM waves and of 455 kc. for the AM waves:

| | |
|---|---|
| Capacitor 50 | 330 micro-microfarads |
| Capacitor 51 | 330 micro-microfarads |
| Capacitor 56 | 10 microfarads |
| Capacitor 61 | 500 micro-microfarads |
| Capacitor 62 | .005 microfarad |

| | |
|---|---|
| Capacitor 75 | .005 microfarad |
| Capacitor 65 | .005 microfarad |
| Capacitor 71 | .05 microfarad |
| Capacitor 77 | .02 microfarad |
| Resistor 55 | 10,000 ohms |
| Resistor 54 | 82 ohms |
| Resistor 72 | 270,000 ohms |
| Resistor 69 | 150,000 ohms |
| Resistor 63 | 2,000,000 ohms |
| Resistor 67 | 10,000,000 ohms |
| Resistor 68 | 270,000 ohms |
| Resistor 76 | 2,000,000 ohms |

There has thus been disclosed an improved AM-FM receiver which does not require any switching in the signal transmission channels such as the carrier-frequency or modulation-frequency circuits. The receiver requires but a single switch for selectively supplying power to one of two converters. A switch of this type is low in cost and may be provided at any place in the receiver. Accordingly, the receiver of the invention provides the greatest possible freedom in layout for the designer and trouble free operation. There is substantially no interaction between the AM and FM circuits, and during FM operation the AM detector is rendered inoperative. The load for the AM detector is partly provided by the FM detector or ratio detector. The automatic gain control circuits are common for both AM and FM operation.

What is claimed is:

1. In a combined frequency-modulated carrier and amplitude-modulated carrier receiver, a first transmission channel for said frequency-modulated carrier waves, a second transmission channel for said amplitude-modulated carrier waves, a switch for selectively supplying power to one of said transmission channels, a frequency discriminator having a frequency discriminator network coupled to said first channel, a pair of rectifiers connected to said discriminator network, a modulation signal output circuit coupled to said rectifiers to derive the frequency modulation signal and including a filter network for by-passing high frequency signals, a resistance-capacitance network including a first resistor connected between said pair of rectifiers, a parallel resonant circuit coupled to said second channel, a further rectifier having a cathode and an anode, a second resistor, said first resistor being connected to said cathode, said parallel resonant circuit being connected to said anode, and said second resistor being connected serially between said first resistor and said parallel resonant circuits, the junction point between said parallel resonant circuit and said second resistor being coupled to said modulation signal output circuit, a modulation signal amplifier channel coupled to said modulation signal output circuit, said filter network including a capacitor effectively by-passing said two resistors, whereby said resistors and said capacitor provide a load for said further rectifier to develop the amplitude modulation signal including a first gain control voltage, said first resistor developing a second gain control voltage in response to said frequency-modulated carrier waves, and said second resistor impressing said second gain control voltage on said further rectifier, an audio filter coupled to said junction point for providing a common automatic gain control output, and means coupled to said audio filter for impressing said gain control voltages on at least one of said channels.

2. An amplitude modulation-frequency modulation receiver comprising means for receiving amplitude modulation and frequency modulated signals, means for applying said frequency modulated signals to a detector, said detector comprising a first and second rectifier connected in series aiding relation, a first impedance connected between the anode of said first rectifier and the cathode of the second rectifier, a tuned circuit coupled to said means for receiving amplitude modulated and frequency modulated signals, a third rectifier and a utilization means, a connection from the end of said first impedance that is connected to the first rectifier anode through a second impedance, said tuned circuit and said third rectifier to the cathode of said second rectifier, a connection from the cathode of said second rectifier through a third impedance to said utilization device, and means for coupling said third rectifier to said utilization device.

KERIM ÖNDER.

References Cited in the file of this patent

UNITED STATES PATENTS

| Number | Name | Date |
|---|---|---|
| 2,173,898 | Conron et al. | Sept. 26, 1939 |
| 2,491,809 | Fyler | Dec. 20, 1949 |
| 2,496,818 | Seeley | Feb. 7, 1950 |